United States Patent
Klausz et al.

(10) Patent No.: US 11,395,407 B2
(45) Date of Patent: Jul. 19, 2022

(54) INTERMEDIATE CIRCUIT ARRANGEMENT AND INVERTER

(71) Applicant: SMA Solar Technology AG, Niestetal (DE)

(72) Inventors: Zoltan Klausz, Guxhagen (DE); Ralf Harbusch, Grebenstein (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 17/162,183

(22) Filed: Jan. 29, 2021

(65) Prior Publication Data

US 2021/0153352 A1    May 20, 2021

Related U.S. Application Data

(63) Continuation of application No. PCT/EP2019/069005, filed on Jul. 15, 2019.

(30) Foreign Application Priority Data

Aug. 9, 2018    (DE) ............... 20 2018 104 586.5

(51) Int. Cl.
*H05K 1/14*        (2006.01)
*H05K 1/02*        (2006.01)
(Continued)

(52) U.S. Cl.
CPC .............. *H05K 1/144* (2013.01); *H02M 7/53* (2013.01); *H05K 1/0298* (2013.01); *H05K 3/368* (2013.01);
(Continued)

(58) Field of Classification Search
CPC .......... H05K 2201/10409; H05K 2201/10015; H05K 2201/041; H05K 1/14; H05K 1/142; H05K 1/144

See application file for complete search history.

(56) References Cited

U.S. PATENT DOCUMENTS 10,582,616 B1 *   3/2020   Chen .................. H05K 1/144
10,965,059 B2 *   3/2021   Tagashira ........... H05K 1/144
(Continued)

OTHER PUBLICATIONS

International Search Report dated Sep. 24, 2019 in connection with PCT/EP2019/069005.

*Primary Examiner* — Paresh Paghadal
(74) *Attorney, Agent, or Firm* — Eschweiler & Potashnik, LLC

(57) ABSTRACT

A disclosed intermediate circuit arrangement includes first and second partial circuit boards of identical design having a series circuit of at least two capacitor banks. The partial circuit boards each have a terminal strip having a positive intermediate circuit connection, a negative intermediate circuit connection, and a central connection. The circuit arrangement also includes a connecting circuit board for electrically connecting the respective connections of the terminal strips of the two partial circuit boards to one another. The connecting circuit board is a multi-layer circuit board with two outer metal layers and at least two inner metal layers arranged between the outer metal layers. The outer metal layers have an electric connection between corresponding connections of the terminal strips of the two partial circuit boards, and at least one first metal layer of the inner metal layers has only an electrical connection of the positive intermediate circuit connections of the two partial circuit boards and at least one second metal layer of the inner metal layers has only an electrical connection of the negative intermediate circuits of the two partial circuit boards. The intermediate circuit arrangement can be part of an inverter.

12 Claims, 3 Drawing Sheets

(51) Int. Cl.
*H02M 7/53* (2006.01)
*H05K 3/36* (2006.01)
(52) U.S. Cl.
CPC .............. *H05K 2201/041* (2013.01); *H05K 2201/10015* (2013.01); *H05K 2201/10409* (2013.01)

(56) References Cited

U.S. PATENT DOCUMENTS

2017/0118858 A1\* 4/2017 Cheng ................ H05K 5/0069
2018/0116065 A1   4/2018 Schuetz
2019/0348828 A1  11/2019 Preising
2021/0072801 A1\* 3/2021 Leopold ................ H05K 7/026

\* cited by examiner

INTERMEDIATE CIRCUIT ARRANGEMENT AND INVERTER

CROSS REFERENCE TO RELATED APPLICATIONS

This application is a continuation of International Patent Application number PCT/EP2019/069005, filed on Jul. 15, 2019, which claims priority to German Patent Application number 20 2018 104 586.5, filed on Aug. 9, 2018, and is hereby incorporated by reference in its entirety.

FIELD

The disclosure relates to an intermediate circuit arrangement and to an inverter having such an intermediate circuit arrangement.

BACKGROUND

Intermediate circuits are often found on the input side of an inverter bridge as a short-term energy store for the electric power to be converted in an inverter. They are formed by capacitors or capacitor banks that are arranged between a positive intermediate circuit connection and a negative intermediate circuit connection. In order to achieve the required capacitance values, a multiplicity of individual capacitors or even a plurality of capacitor banks are connected in parallel. The capacitor banks may in this case be arranged on different printed circuit boards.

Specifically in the case of multilevel inverter bridges, a further plurality of capacitor banks are connected in series here. The connection points between the series-connected capacitor banks then provide intermediate values of the input voltage. Two, three or even four capacitor banks are usually connected in series here in order also to provide one, two or three additional voltage values for the multilevel inverter bridge in addition to the positive and negative intermediate circuit voltage.

Since high currents sometimes flow through the various connections of an intermediate circuit arrangement described above, complex connection technology is required for the intermediate circuit arrangement. At the same time, it is desirable for capacitor banks that are arranged on different printed circuit boards to be able to be designed to be as structurally identical as possible in order to keep the number of different components in an inverter low.

SUMMARY

The disclosure is directed to an intermediate circuit arrangement or an inverter in which partial circuit boards of structurally identical design and comprising capacitor banks are able to be connected, with little effort and low impedance, to one another and to further components of an electrical device, in particular of an inverter.

An intermediate circuit arrangement according to the disclosure comprises structurally identical first and second partial circuit boards comprising a series connection of at least two capacitor banks, wherein the partial circuit boards each have a terminal strip with in each case a positive intermediate circuit connection, a negative intermediate circuit connection and a center connection. A connecting circuit board for electrically connecting respective connections of the terminal strips of the two partial circuit boards to one another is designed as a multilayer circuit board having two outer metal layers and at least two inner metal layers arranged between the outer metal layers, wherein the outer metal layers each comprise an electrical connection between corresponding connections of the terminal strips of the two partial circuit boards. In addition, at least one first metal layer of the inner metal layers comprises only an electrical connection of the positive intermediate circuit connections of the two partial circuit boards and at least one second metal layer of the inner metal layers comprises only an electrical connection of the negative intermediate circuit connections of the two partial circuit boards.

In one embodiment, the partial circuit boards comprise a series connection of four capacitor banks, and their terminal strips further have a positive half-connection and a negative half-connection, wherein the outer metal layers further comprise a respective electrical connection between the positive half-connections and between the negative half-connections of the two partial circuit boards. By virtue of the division into four capacitor banks, it is possible firstly to use capacitors with a lower permissible maximum voltage, and it is possible secondly also to connect inverter bridges having more voltage levels, for example in this case a 5-level inverter bridge, to an intermediate circuit formed by the series connection.

The connecting circuit board advantageously comprises electrical contact surfaces containing bores, via which the connecting circuit board is able to be screwed in each case, by way of corresponding bores, into the contact surfaces of the terminal strips of the partial circuit boards and thereby be put into electrical contact therewith. Such connection technology has proven to be inexpensive and reliable in production with a high current carrying capacity.

The screw connection of the connecting circuit board to the respective partial circuit boards may additionally serve to hold the intermediate circuit arrangement in a housing or on a printed circuit board. In this case, the intermediate circuit arrangement may be screwed to a thread which is made of electrically insulating material, for example plastic, and which is fixedly installed in the housing. An additional holder for holding the intermediate circuit arrangement at other points in the housing is of course not ruled out.

In addition, connection lines for a voltage source may be screwed at least to the positive and the negative intermediate circuit connection via cable lugs.

In one embodiment, each of the two partial circuit boards comprises a respective terminal strip on opposing sides, which terminal strips are in particular arranged level with one another. As a result, the electrical connection between the individual connections of partial circuit boards arranged next to one another may be implemented via the connecting circuit board over a particularly short path and thus with particularly low impedance. There are then remaining unused terminal strips on the two partial circuit boards.

In one embodiment, the partial circuit boards further comprise at least one bridge circuit, the input connections of which are connected to the intermediate circuit connections of the partial circuit board. For example, three bridge circuits may in each case be arranged on a partial circuit board, the bridge outputs of which bridge circuits each form phase connections for connection to a three-phase AC grid. An intermediate circuit arrangement according to the disclosure might of course also not have any bridge circuits on the partial circuit boards.

In a further embodiment, the connecting circuit board has a plurality of inner metal layers that are arranged adjacent to one another and via which the positive intermediate circuit connections of the two partial circuit boards are connected to one another. The negative intermediate circuit connections of the two partial circuit boards may accordingly also be connected to one another via a plurality of inner metal layers, which are likewise arranged adjacent to one another. This group-wise arrangement makes it possible to achieve an advantageously low-impedance connection between the partial circuit boards.

In one embodiment, an inverter comprises an intermediate circuit arrangement described above. In this embodiment, each of the partial circuit boards may comprise at least one bridge circuit, and each partial circuit board particularly has exactly three bridge circuits. The outputs of these bridge circuits each form a phase connection for connecting to an AC grid.

In the case of three bridge circuits per partial circuit board, it is advantageous to assign two of the bridge circuits to a common phase of a three-phase AC voltage output on each partial circuit board. The two remaining individual phase connections of both partial circuit boards, for example, the phase connections of the two partial circuit boards that are at the smallest distance from one another, that is to say the inner phase connections, are then combined to form the common third phase of the AC voltage output. The three phase outputs are thereby easily able to be guided in the housing in a manner spatially separated from one another and connected to further components such as line chokes.

BRIEF DESCRIPTION OF THE DRAWINGS

The disclosure is illustrated below with the aid of figures, in which.

DETAILED DESCRIPTION

Figure 1:
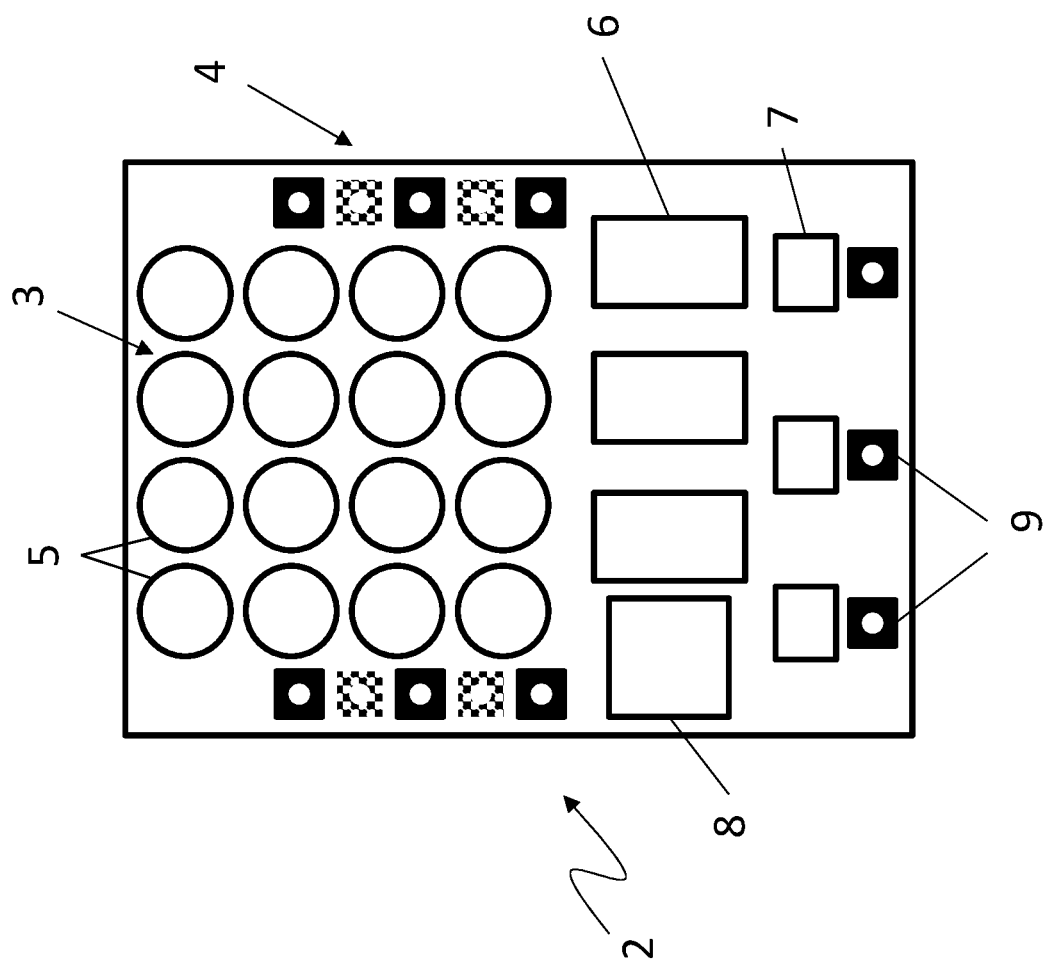
FIG. 1 shows an embodiment of a partial circuit board of an intermediate circuit arrangement according to the disclosure.

FIG. 1 shows a partial circuit board 2 for the construction of an intermediate circuit arrangement according to the disclosure. The partial circuit board comprises a multiplicity of capacitors 5 that are combined to form series-connected capacitor banks 3. The capacitor banks 3 serve as an input-side intermediate circuit, for example for one or more inverter bridges, which are arranged on the partial circuit board 2 in the form of power modules 6. On the output side, the inverter bridges in this embodiment are each connected to phase connections 9, assigned to the inverter bridges, via current sensors 7. A controller 8 controls the power modules 6 during operation and receives the measurement signals from the current sensors 7.

Terminal strips 4, which are electrically connected to connections of the capacitor banks 3, are arranged on opposing sides of the partial circuit board 2. In the case of two series-connected capacitor banks 3, the terminal strip 4 comprises three terminals, each of which has a central bore and of which one respective terminal is connected to one of the two end connections of the series connection of the capacitor banks and one terminal is connected to the center point of the series connection. If the series connection comprises more than two capacitor banks, the terminal strip 4 comprises a corresponding number of further terminals that are each electrically connected to the further intermediate points between the capacitor banks. For instance, if four capacitor banks 3 are connected in series, then five terminals are required in the terminal strip 4. The two additional optional terminals are therefore shown in hatched form.

The terminal strips 4 are arranged level on the opposing sides of the partial circuit board 2 and along an alignment axis, such that the terminals of two partial circuit boards 2 arranged next to one another are easily able to be electrically connected to one another and for example to a voltage source via a connecting circuit board.

Other arrangements, for example an offset arrangement of the contact surfaces, are of course also conceivable.

Figure 2:
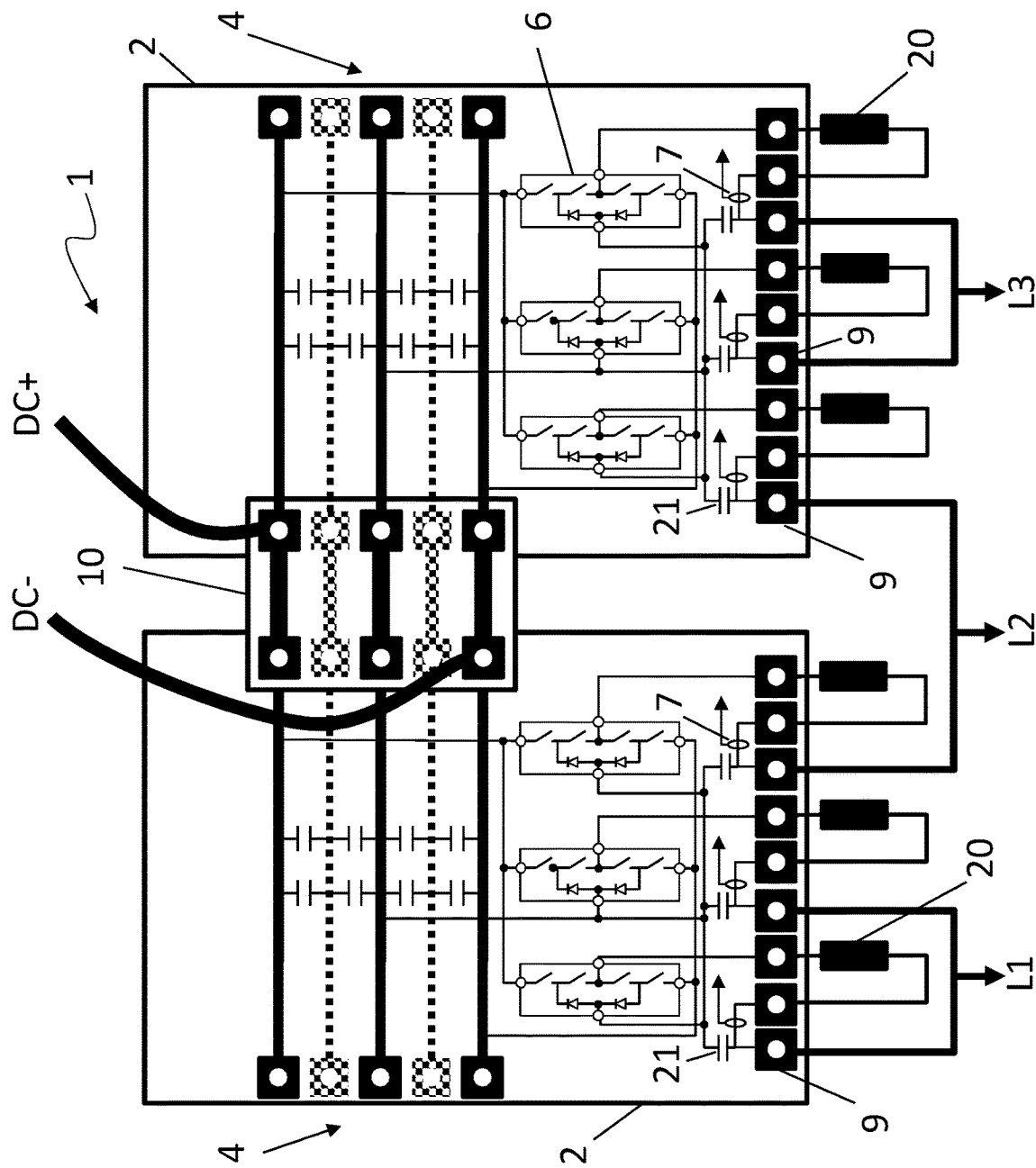
FIG. 2 shows an embodiment of an intermediate circuit arrangement according to the disclosure.

Such an intermediate circuit arrangement 1 is shown in FIG. 2. The opposing terminal strips 4 of two partial circuit boards 2 are covered by a connecting circuit board 10, the terminals of which are aligned over the terminals on the two partial circuit boards 2. This allows for example screws to be guided through the aligned bores of the connecting circuit board 10 and the partial circuit board 2, such that the contact surfaces of the terminals of the connecting circuit board 10 and of the partial circuit board 2 are pressed against one another by the screw connection and establish reliable electrical contact. The screws may also be used to screw cable lugs to the terminals and to electrically connect them, such that for example a voltage source, such as a photovoltaic generator, may be connected to the partial circuit boards 2 via cables. Two connection cables for the connections DC+, DC− of the voltage source are shown symbolically. The screws here may also be screwed for example into an electrically insulating thread, wherein the thread is fixedly connected to a housing.

A holding function for the entire intermediate circuit arrangement may thereby also be implemented at the same time.

FIG. 2 further shows an example of an arrangement of four series-connected capacitor banks 3 and an NPC inverter bridge as power module 6. Other inverter bridge topologies may of course also be used. The bridge outputs of the power modules 6 are in this case each initially connected, via a first AC connection, to a connection of a choke 20, which is not arranged on the partial circuit boards for reasons of space, as part of a line filter, the other connection of which is in turn connected to an associated second AC connection. The second AC connection is in turn connected to a phase connection 9, assigned to the respective inverter bridge 6, via a current sensor 7. Another capacitor 21, arranged on the partial circuit board, branches off from this connection as a further part of the line filter. The capacitors 21 are connected jointly, by way of a connection, to the center point of the series connection of the intermediate circuit arrangement.

The phase connections of the two partial circuit boards 2 are combined for connection to a three-phase grid with phases L1, L2 and L3 in such a way that two phase connections of each partial circuit board 2 each form a phase L1, L3, and only the phase L2 is formed by phase connections of both partial circuit boards 2. Further chokes may be integrated into the phases L1, L2, L3 as line filter components (not shown).

Figure 3:
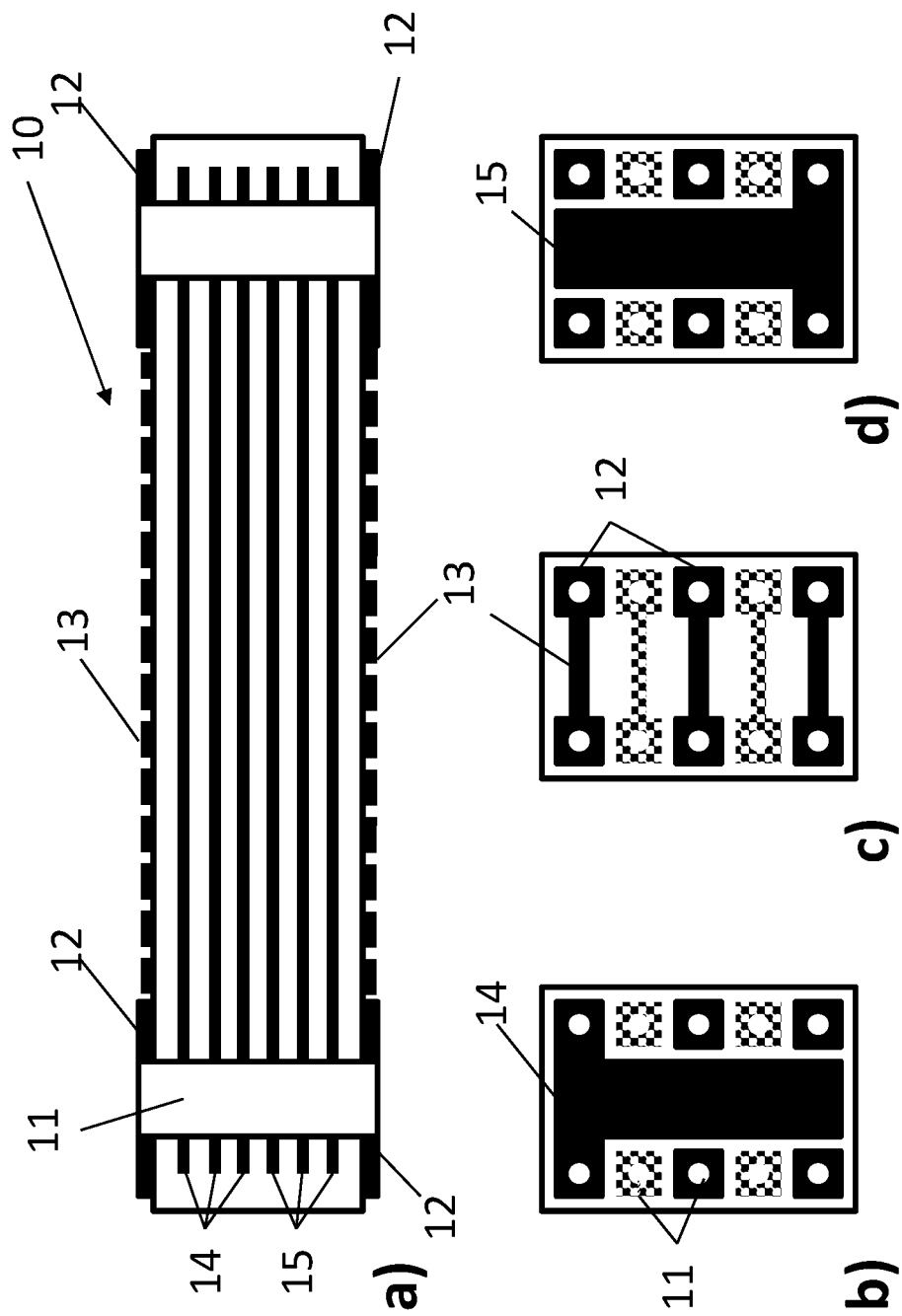
FIG. 3 shows a cross section through a connecting circuit board of an intermediate circuit arrangement according to the disclosure.

A structural design of the connecting circuit board 10 is shown in more detail in FIGS. 3a-3d, wherein FIG. 3a shows a cross section through a connecting circuit board 10, while FIGS. 3b, 3c and 3d show the structure of different metal layers within the connecting circuit board 10.

The connecting line 10 is constructed here as a multilayer printed circuit board that comprises two outer metal layers 13 on opposing outer sides of the printed circuit board, as well as a plurality of inner metal layers 14, 15. The outer metal layers 13 comprise contact surfaces 12, in the center of which a bore extending in each case over the entire thickness of the printed circuit board ends.

The inner metal layers are each electrically connected to the contact surfaces 12 at least in the region between the contact surfaces 12 of the two outer sides, either via a conductive lining of the bore or using vias, not shown, extending between the metal layers.

FIG. 3c shows a structure of the outer metal layer 13. In this case, a conductor track that connects the two contact surfaces to one another in each case extends between opposing contact surfaces 12 that are assigned to like connections of the terminal strip 4 of the two partial circuit boards. This structure is implemented for both outer metal layers 13.

Since the contact surfaces assigned to the end points of the series connection of the capacitor banks usually have to have the highest current carrying capacity because the voltage source is connected here, the conductor tracks of the outer metal layer are not sufficient to reliably and permanently channel the currents that occur during operation. Therefore, further conductor tracks for connecting the corresponding terminals 12 are provided in the inner metal layers 14, 15. A first metal layer 14 is shown in FIG. 3b and in this case has only one conductor track structure that electrically connects two opposing contact surfaces to one another, these being assigned to one of the connections of the voltage source. This conductor track structure takes up as large a space as possible within the metal layer 14 in order to provide a conductor track with maximum current carrying capacity between the contact surfaces. The other contact surfaces remain unconnected here. A second metal layer 15 shown in FIG. 3d accordingly comprises only one conductor track structure that electrically connects two opposing contact surfaces to one another, these being assigned to the other connection of the voltage source. This conductor track structure likewise takes up as large a space as possible within the metal layer 15 in order to provide a conductor track with maximum current carrying capacity between the contact surfaces.

Within the multilayer printed circuit board, enough identical first metal layers 14 are arranged directly adjacent to one another that the current carrying capacity of the arrangement is sufficient for the maximum permissible current of the voltage source. The second metal layers 15 are also arranged directly adjacent to one another and in the same number. This thereby creates a connecting circuit board 10 with an advantageously low impedance.

A person skilled in the art understands that the order and arrangement of the contact surfaces 12 within the connecting circuit board 10 or the terminal strips 4 of the partial circuit boards 2 may also be configured differently than shown here by way of example.

The invention claimed is:

1. An intermediate circuit arrangement, comprising:
structurally identical first and second partial circuit boards comprising a series connection of at least two capacitor banks, wherein the first and second partial circuit boards each have a terminal strip with, in each case, a positive intermediate circuit connection, a negative intermediate circuit connection and a center connection,
a connecting circuit board configured to electrically connect respective connections of the terminal strips of the first and second partial circuit boards to one another,
wherein the connecting circuit board is a multilayer circuit board having two outer metal layers and at least two inner metal layers arranged between the outer metal layers,
wherein the outer metal layers each comprise an electrical connection between corresponding connections of the terminal strips of the first and second partial circuit boards, and
wherein at least one first metal layer of the at least two inner metal layers comprises only an electrical connection of the positive intermediate circuit connection of the first and second partial circuit boards and at least one second metal layer of the at least two inner metal layers comprises only an electrical connection of the negative intermediate circuit connection of the first and second partial circuit boards.

2. The intermediate circuit arrangement as claimed in claim 1, wherein the series connection of at least two capacitor banks comprises a series connection of four capacitor banks, and their terminal strips furthermore have a positive half-connection and a negative half-connection, and wherein the outer metal layers further comprise a respective electrical connection between the positive half-connection and between the negative half-connection of the first and second partial circuit boards.

3. The intermediate circuit arrangement as claimed in claim 1, wherein the connecting circuit board comprises electrical contact surfaces containing bores, via which the connecting circuit board is configured to be screwed or otherwise attached, in each case, to the first and second partial circuit boards and thereby be put into electrical contact therewith.

4. The intermediate circuit arrangement as claimed in claim 3, wherein a screw connection of the connecting circuit board to the respective one of the first and second partial circuit boards additionally serves to hold the intermediate circuit arrangement in a housing or on a third circuit board.

5. The intermediate circuit arrangement as claimed in claim 1,
wherein on each of the structurally identical first and second partial circuit boards, terminal strips of the first partial circuit board are leveled with respective terminal strips of the second partial circuit board.

6. The intermediate circuit arrangement as claimed in claim 1, wherein the first and second partial circuit boards further each comprise at least one bridge circuit, and an input connection of each of the first and second partial circuit boards is connected to the positive intermediate circuit connection of the respective first and second partial circuit board.

7. The intermediate circuit arrangement as claimed in claim 1, further comprising cable lugs screwed, in each case, to connection lines at least at the positive and the negative intermediate circuit connections.

8. The intermediate circuit arrangement as claimed in claim 1, wherein the at least two inner metal layers of the connecting circuit board are arranged adjacent to one another and via which the positive intermediate circuit connection of the two partial circuit boards are connected to one another.

9. An inverter having the intermediate circuit arrangement as claimed in claim 1.

10. The inverter as claimed in claim 9, wherein the first and second partial circuit boards each comprise at least one bridge circuit.

11. The inverter as claimed in claim 9, wherein the first and second partial circuit boards each comprise exactly three bridge circuits.

12. The inverter as claimed in claim 11, wherein two of the bridge circuits are assigned to a common phase of a three-phase AC voltage output on each of the first and second partial circuit boards.

\* \* \* \* \*